US009814154B2

United States Patent
Nakazawa et al.

(10) Patent No.: US 9,814,154 B2
(45) Date of Patent: Nov. 7, 2017

(54) POWER CONVERTER

(71) Applicant: Hitachi Automotive Systems, Ltd., Hitachinaka-shi, Ibaraki (JP)

(72) Inventors: Tatsuya Nakazawa, Hitachinaka (JP); Hidenori Shinohara, Hitachinaka (JP); Yoshiharu Yamashita, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 15/026,041

(22) PCT Filed: Oct. 1, 2014

(86) PCT No.: PCT/JP2014/076234
§ 371 (c)(1),
(2) Date: Mar. 30, 2016

(87) PCT Pub. No.: WO2015/053139
PCT Pub. Date: Apr. 16, 2015

(65) Prior Publication Data
US 2016/0242308 A1    Aug. 18, 2016

(30) Foreign Application Priority Data

Oct. 7, 2013  (JP) ................. 2013-210129

(51) Int. Cl.
*H02M 7/02* (2006.01)
*H02M 7/26* (2006.01)
(Continued)

(52) U.S. Cl.
CPC ...... *H05K 7/1407* (2013.01); *H02M 3/33546* (2013.01); *H02M 3/33576* (2013.01);
(Continued)

(58) Field of Classification Search
CPC .......... H02M 7/02; H02M 7/026; H05K 7/06; H01R 31/02
See application file for complete search history.

(56) References Cited

U.S. PATENT DOCUMENTS

| | | | | |
|---|---|---|---|---|
| 5,558,531 A | * | 9/1996 | Ikeda | ..................... H01R 13/28 439/287 |
| 5,759,055 A | * | 6/1998 | Colantuano | ............. H01R 9/18 439/287 |

(Continued)

FOREIGN PATENT DOCUMENTS

| | | |
|---|---|---|
| JP | 2006-41410 A | 2/2006 |
| JP | 2013-34273 A | 2/2013 |

(Continued)

OTHER PUBLICATIONS

International Search Report (PCT/ISA/210) issued in PCT Application No. PCT/JP2014/076234 dated Jan. 6, 2015 with English translation (5 pages).

(Continued)

*Primary Examiner* — Timothy J Dole
*Assistant Examiner* — Sisay G Tiku
(74) *Attorney, Agent, or Firm* — Crowell & Moring LLP

(57) ABSTRACT

Provided is a power converter without a crack in a board or peeling-off of a pattern at the time of being grounded to a metal base. A GND protruding terminal is molded in a metal base in an integrated manner. A drive circuit board is provided with rectifier elements, first to third wiring patterns, and a ground pattern. A ground metal conductor, which connects the ground pattern and the metal base, is placed on a top surface of the GND protruding terminal, and is screwed to a female screw portion of the GND protruding terminal.

9 Claims, 14 Drawing Sheets

(51) Int. Cl.
  *H02M 7/00* (2006.01)
  *H05K 7/14* (2006.01)
  *H02M 3/335* (2006.01)
  *H05K 7/20* (2006.01)
  *B60L 11/18* (2006.01)

(52) U.S. Cl.
  CPC ....... H05K 7/1432 (2013.01); H05K 7/20927 (2013.01); B60L 11/1803 (2013.01)

(56) References Cited

U.S. PATENT DOCUMENTS

| | | | | |
|---|---|---|---|---|
| 5,934,923 | A * | 8/1999 | Matsuoka | H01R 11/12 439/287 |
| 6,648,698 | B1 * | 11/2003 | Achtner | H01R 4/66 439/737 |
| 7,487,687 | B2 * | 2/2009 | Sumi | B60N 2/002 73/862.391 |
| 2002/0024120 | A1 | 2/2002 | Yoshimatsu et al. | |
| 2005/0003703 | A1 * | 1/2005 | Ono | H01R 11/26 439/516 |
| 2007/0072455 | A1 * | 3/2007 | Onuma | H01R 9/0518 439/98 |
| 2010/0172770 | A1 * | 7/2010 | Ichise | F04B 35/04 417/366 |
| 2010/0321889 | A1 * | 12/2010 | Yoshino | H05K 7/20927 361/702 |
| 2011/0096524 | A1 * | 4/2011 | Kameyama | H01R 13/506 361/818 |
| 2012/0244759 | A1 * | 9/2012 | Tsuji | H01R 4/029 439/877 |
| 2013/0094269 | A1 * | 4/2013 | Maeda | H02M 7/003 363/141 |
| 2013/0100634 | A1 * | 4/2013 | Okubo | H01F 27/36 361/816 |
| 2014/0240946 | A1 | 8/2014 | Fukumasu et al. | |
| 2014/0246768 | A1 | 9/2014 | Soyano | |
| 2015/0306960 | A1 * | 10/2015 | Sobu | H02M 1/44 307/10.1 |
| 2016/0079684 | A1 * | 3/2016 | Naganishi | H01R 11/12 439/877 |
| 2017/0040907 | A1 * | 2/2017 | Goto | H02M 3/28 |

FOREIGN PATENT DOCUMENTS

| | | |
|---|---|---|
| JP | 2013-99057 A | 5/2013 |
| JP | 2013-176218 A | 9/2013 |
| WO | WO 2013/084589 A1 | 6/2013 |

OTHER PUBLICATIONS

Japanese-language Written Opinion (PCT/ISA//237) issued in PCT Application No. PCT/JP2014/076234 dated Jan. 6, 2015 (4 pages).
Extended European Search Report issued in counterpart European Application No. 14852207.1 dated Jun. 13, 2017 (Nine (9) pages).

* cited by examiner

POWER CONVERTER

TECHNICAL FIELD

The present invention relates to a power converter, and more particularly, to a power converter provided with a structure in which a ground pattern of a drive circuit board is connected to a metal base.

BACKGROUND ART

A vehicle, such as a hybrid vehicle, a plug-in hybrid vehicle, and an electric car, is provided with a high-voltage storage battery for power driving, an inverter device configured to perform power conversion. of a DC high voltage output of the high-voltage storage battery into an AC high voltage output and drive a motor, a DC-DC converter apparatus configured to convert the DC high voltage output of the high-voltage storage battery into a DC low voltage output and perform power supply to a low voltage load such as a light or a radio of the vehicle, and a low-voltage storage battery as an auxiliary power source of the low voltage load being mounted thereon.

In general, the DC-DC converter apparatus is provided with a high-voltage switching circuit which converts a DC high voltage into an AC. voltage, a transformer which insulates and converts the AC high voltage into an AC low voltage, low-voltage rectifier circuit which converts the AC low voltage into a DC voltage, and an output terminal which outputs the voltage-converted voltage. There is provided a DC-DC converter apparatus which adopts a metal case in order to dissipate heat generated by a plurality of switching elements configuring the high-voltage switching circuit and a plurality of rectifier elements configuring a constant-voltage rectifier circuit.

Such a DC-DC converter apparatus has a structure in which a transformer, a step-down circuit section, a step-up circuit. section, and a control circuit section are mounted onto an inner surface of the metal. case, and the step-down circuit section and the step-up circuit section are formed using a metal circuit board (for example, see paragraph [0018] of PTL 1)

CITATION LIST

Patent Literature

PTL 1: Japanese Patent Application Laid-Open No. 2013-99057

SUMMARY OF INVENTION

Technical Problem

Ground patterns of the step-down circuit section and. the step-up circuit. section are connected to the metal case. Although not described in PTL 1 described above, the step-down circuit board and the step-up circuit board are fixed to the metal case using a fastening member such as a screw, and the ground pattern and the metal case are electrically connect to each other. The fastening member having a large head outer diameter is used for the step-down circuit board and the step-up circuit board in order improve the resistance to vibration, secure a discharge path and a current channel with a large area, or the like. Thus, when a resin substrate such as glass fiber-containing epoxy resin is used as the step-down circuit board and the step-up circuit board in order to achieve reduction in weight and cost reduction of the DC-DC converter apparatus, a crack in the board or peeling-off of the pattern is caused by a fastening force at the time of fastening through the fastening member.

Solution to Problem

A power converter according to the present invention is provided with a metal base in which a protruding portion including a ground attachment surface provided; a transformer which is mounted to the metal base and performs power conversion between an input side and an output side; at least a pair of rectifier elements which controls input and output of current of the transformer; a drive circuit board which is attached to the metal base, and in which first and second wirings and a ground pattern to supply a main current to each of the rectifier elements are provided; and a ground metal conductor which is installed on the ground attachment surface of the protruding portion and is connected to the ground pattern.

Advantageous Effects of Invention

According to the present invention, the ground pattern and the metal base are connected in a state in which the ground metal conductor is installed on the ground attachment surface of the protruding portion. Thus, it is possible to prevent a crack of the drive circuit board or peeling-off of the pattern.

DESCRIPTION OF EMBODIMENTS

A DC-DC converter apparatus illustrated as an embodiment of a power converter of the present invention is used in an electric car, a plug-in hybrid vehicle, or the like. A high-voltage storage battery is mounted as a power source of a motor for driving to such a vehicle, and further, a low-voltage storage battery configured to operate an auxiliary machine such as a light or a radio is mounted thereto. The DC-DC converter apparatus is provided with a high-voltage switching circuit, a low-voltage rectifier circuit, and a transformer which connects these circuits to each other, and performs power conversion of a high voltage of the high-voltage storage battery into a low voltage, or power conversion of a low voltage of the low-voltage storage battery into a high voltage. The DC-DC converter apparatus of the present invention is particularly provided with a ground metal conductor which connects a ground pattern provided in a drive circuit board to a metal base, and the ground metal conductor has a configuration of being installed on a ground attachment surface provided in the metal base and being attached to the metal base. Accordingly, it is possible to prevent a crack in the board or peeling-off of the pattern caused by a fastening force with respect to the drive circuit board or the like. Hereinafter, the embodiment. of the DC-DC converter apparatus of the present invention will he described with reference to the drawings.

[Circuit Configuration of DC-DC Converter Apparatus]

Figure 1:
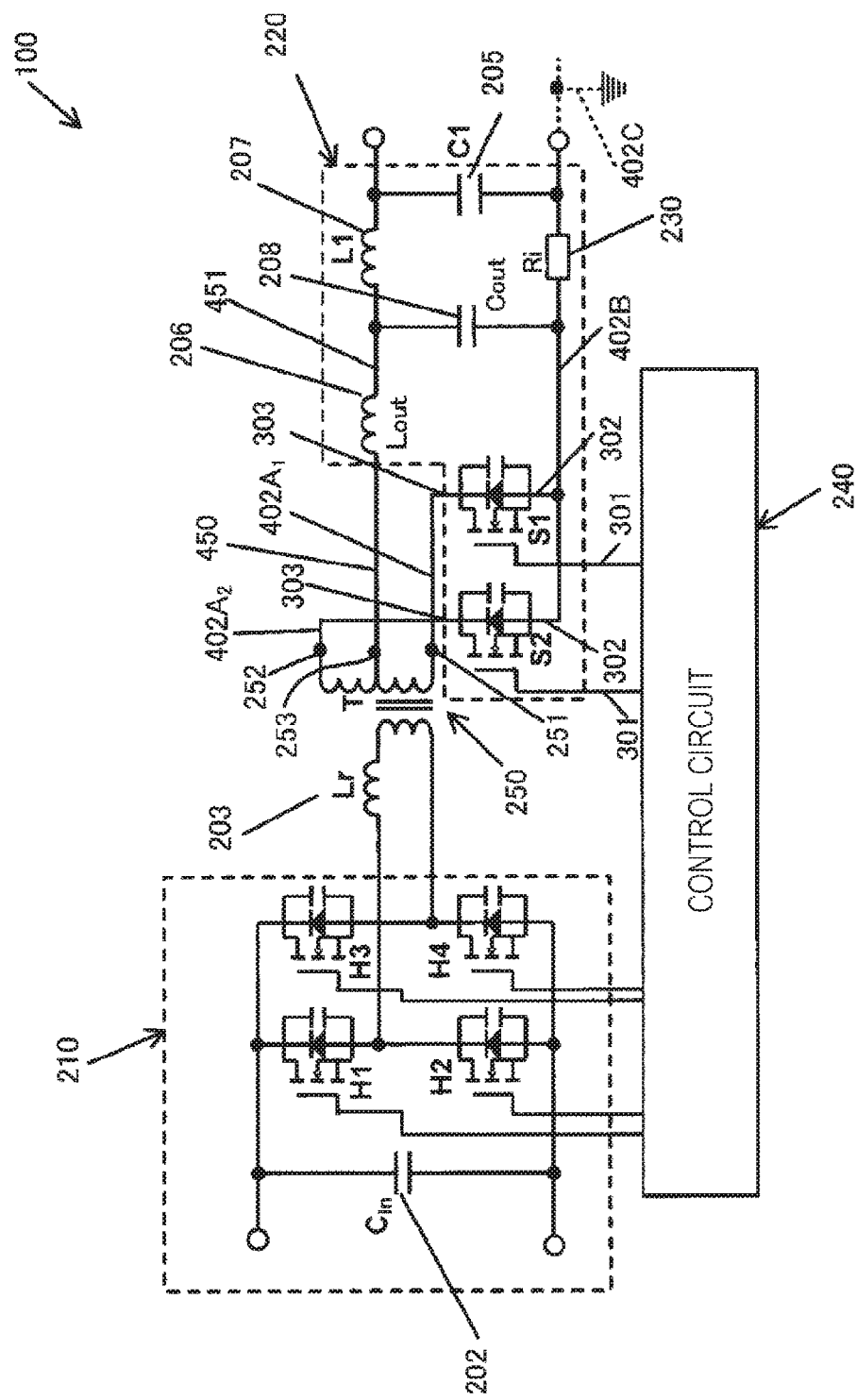
FIG. 1 is a diagram illustrating a main circuit of a DC-DC converter apparatus as an embodiment of a power converter.

FIG. 1 is a circuit diagram of a DC-DC converter apparatus 100 of the present invention. This DC-DC converter apparatus 100 is provided with a high-voltage-side switching circuit 210 which converts a DC high voltage into an AC voltage, a main transformer 250 which converts the AC high voltage to an AC low voltage, and a low-voltage-side rectifier circuit 220 which converts the AC low voltage into a DC voltage. The high-voltage-side switching circuit 210 and the low-voltage-side rectifier circuit 220 are switching-controlled by a control circuit 240.

A resonant coil 203 (Lr) is connected. between the high-voltage-side switching circuit 210 and the main transformer 250, and it becomes possible to perform zero-voltage switching of a MOSFET configuring the high-voltage-side switching circuit 210 by using a combined inductance of an inductance of this resonant coil 203 and a leakage inductance of the main transformer 250.

A filter coil 207 (L1) and a filter capacitor 205 (C1) are provided on an output side of the low-voltage-side rectifier circuit 220 in order to remove noise superimposed on the output voltage. Incidentally, the resonant coil 203, the filter coil 207 and the filter capacitor 205 can be omitted.

(Circuit Configuration of High-Voltage-Side Switching Circuit)

The high-voltage-side switching circuit 210 is configured of four MOSFET's H1 to H4, connected as an H-bridge type, and a smoothing input capacitor 202 (Cin). A snubber capacitor is provided in parallel to each of the MOSFET's H1 to H4. The AC voltage is generated on a primary side of the main transformer 250 by performing phase-shift PWM control of the four MOSFET's H1 to H4 of the high-voltage-side switching circuit 210.

(Circuit Configuration of Low-Voltage-Side Rectifier Circuit)

The low-voltage-side rectifier circuit 220 includes two rectification phases configured. using MOSFET's S1 and S2, and a smoothing circuit configured using a choke coil 206 (Lout) and a smoothing capacitor 208 (Cout). High-potential-side wirings of the respective rectification phases, that is, drain-side wirings of the MOSFET's S1 and S2 are connected to coil terminals (output terminals) 251 and 252 on a secondary side of the main transformer 250 (see FIG. 11 and the like). A center tap terminal 253 (see FIG. 11 and the like) on the secondary side of the transformer 250 is connected to the choke coil 206 (Lout) and the smoothing capacitor 208 (Gout) is connected to an output. side of the choke coil 206 (Lout). In addition, the smoothing circuit, configured of the filter coil 207 (L1) and the filter capacitor 205 (C1), is also provided in the low-voltage-side rectifier circuit 220.

Incidentally, FIG. 1 illustrates the two MOSFET's S1 and S2 as the rectifier element for convenience. FIGS. 2 to 4, and 10 to 14, which will be described later, illustrate three pairs of MOSFET's (six, in total) as the rectifier element. The number of MOSFET's is appropriately defined upon design.

In FIG. 1, a drive signal is supplied from the control circuit 240 via a first wiring pattern 301 (see FIG. 12 or the like) for drive signal transmission to gates of the MOSFET's S1 and S2. A drain terminal of the MOSFET S1 is connected to the high-potential-side coil terminal 252 (see FIG. 11 and the like) on the secondary side of the main transformer 250 via a third wiring pattern 303 for main current transmission, and a drain terminal of the MOSFET S2 is connected to the low-potential-side coil terminal 251 on the secondary side of the main transformer 250 (see FIG. 12 or the like) via the third wiring pattern 303 for main current transmission. Source terminals of the MOSFET's S1 and S2 are connected to a second wiring pattern 302 for main current transmission, and are grounded via a shunt resistance 230 (Ri) configured to detect current.

Incidentally, the DC-DC converter apparatus 100 can be provided with an active clamp circuit configured to suppress a surge voltage which is applied to the MOSFET's S1 and S2 of the low-voltage-side rectifier circuit 220. The active clamp circuit is provided with an active clamp MOSFET and an active clamp capacitor.

[Overall Structure of DC-DC Converter Apparatus 100]

Figure 2:
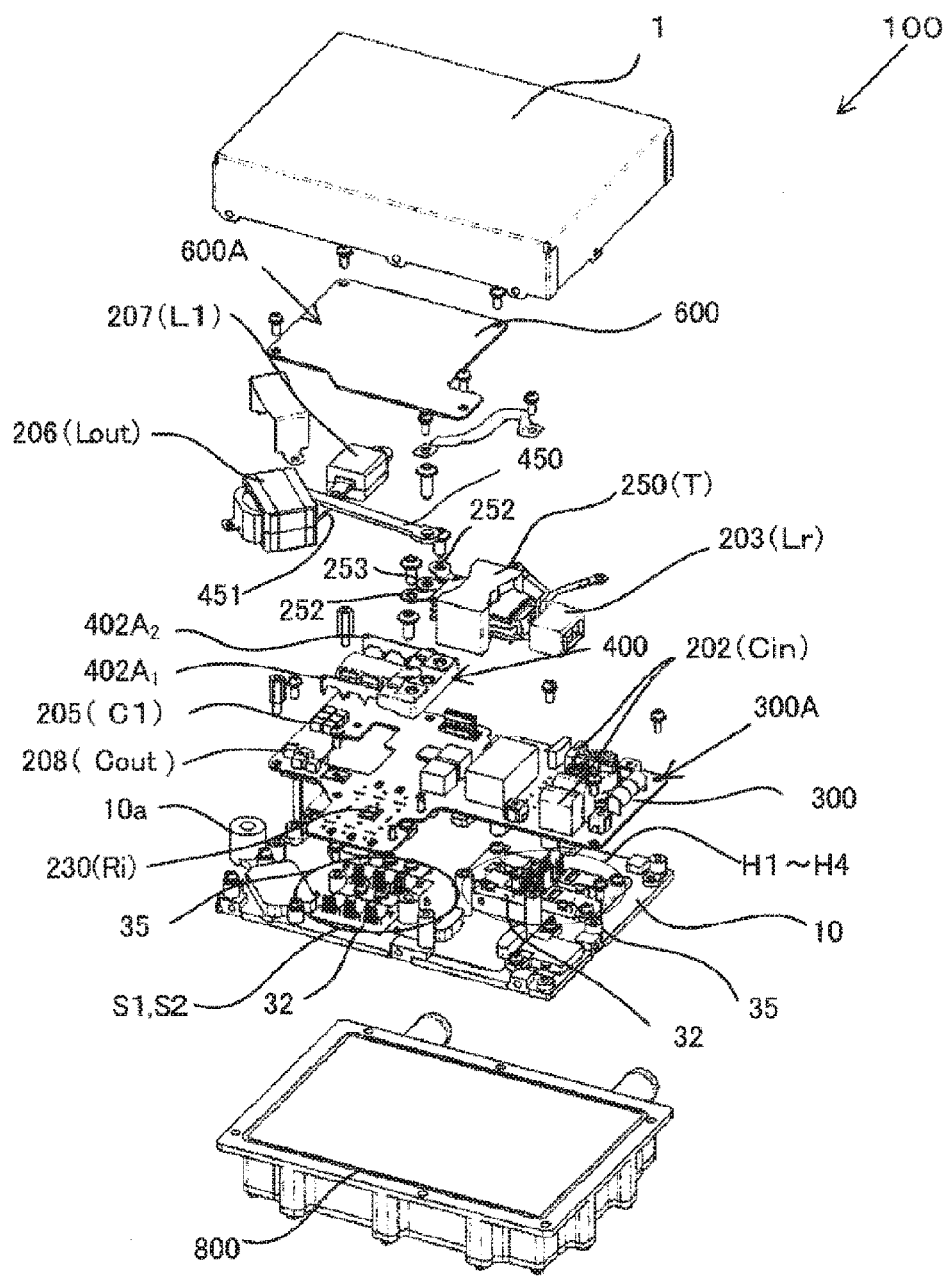
FIG. 2 is an exterior exploded perspective view of the DC-DC converter apparatus illustrated in FIG. 1.
Figure 3:
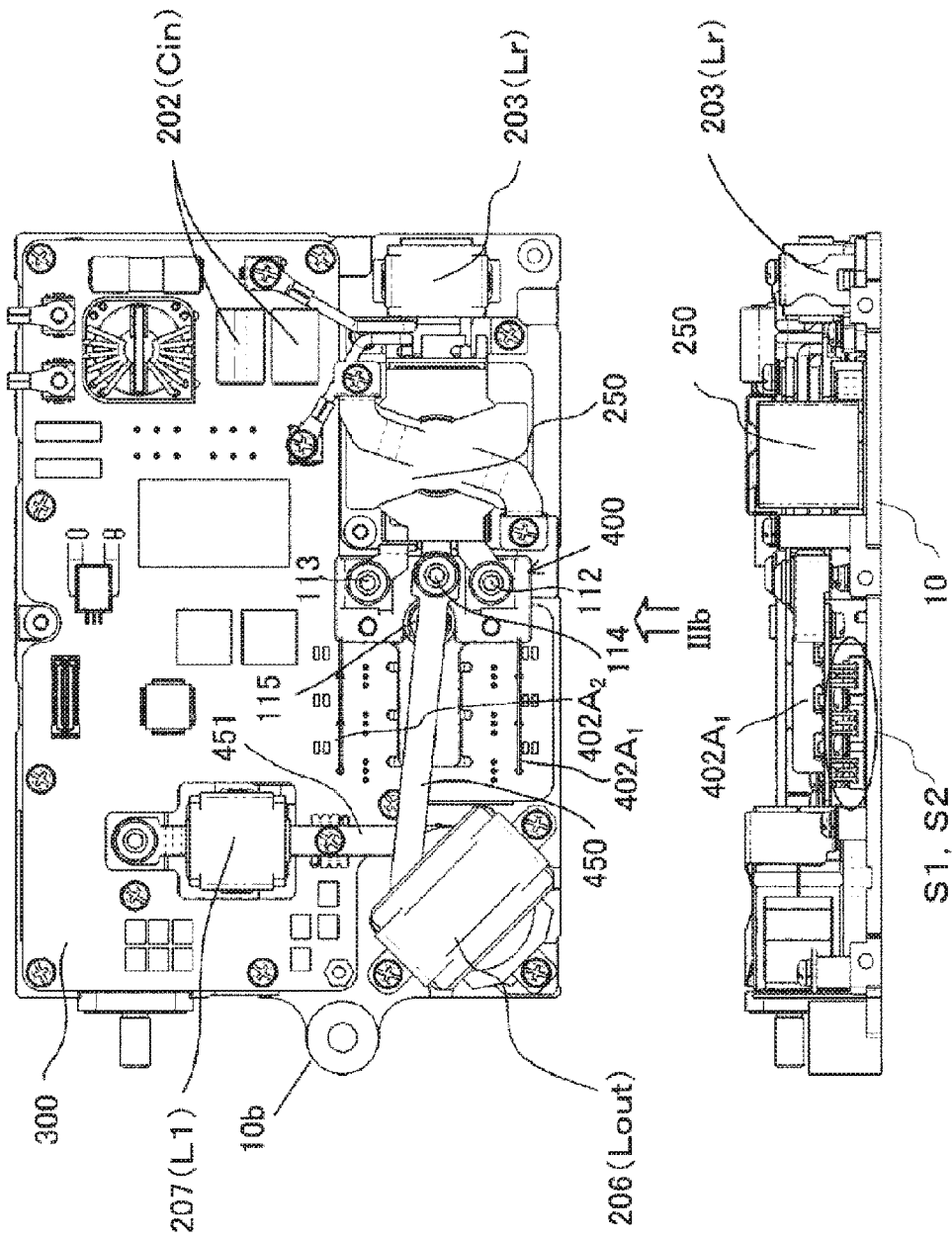
FIG. 3A is a plan view of an exemplary embodiment of the DC-DC converter apparatus of FIG. 2.
FIG. 3B is a side view of FIG. 3A which is seen from IIIb.

The overall structure of DC-DC converter apparatus 100 will be described with reference to FIGS. 2, 3(a) and 3(b). FIG. 2 is an exploded perspective view of the DC-DC converter apparatus 100 illustrated in FIG. 1, and FIGS. 3(a) and 3(b) are diagrams illustrating the arrangement of component parts of the DC-DC converter apparatus 100 illustrated in FIG. 2.

The DC-DC converter apparatus 100 is provided with a metal base 10, which has a rectangular shape and made of metal, for example, aluminum die casting, and the members configuring a DC-DC converter circuit, which have been described in FIG. 1, are attached onto the metal base 10. These members are covered by a top cover 1. A drive circuit board assembly 300A provided with high-voltage and low-voltage circuit sections, a main transformer 250 (T), the resonant coil 203 (Lr), the choke coil 206 (Lout), and a control circuit board assembly 600A are attached to the metal base 10.

(Metal Base)

Figure 9:
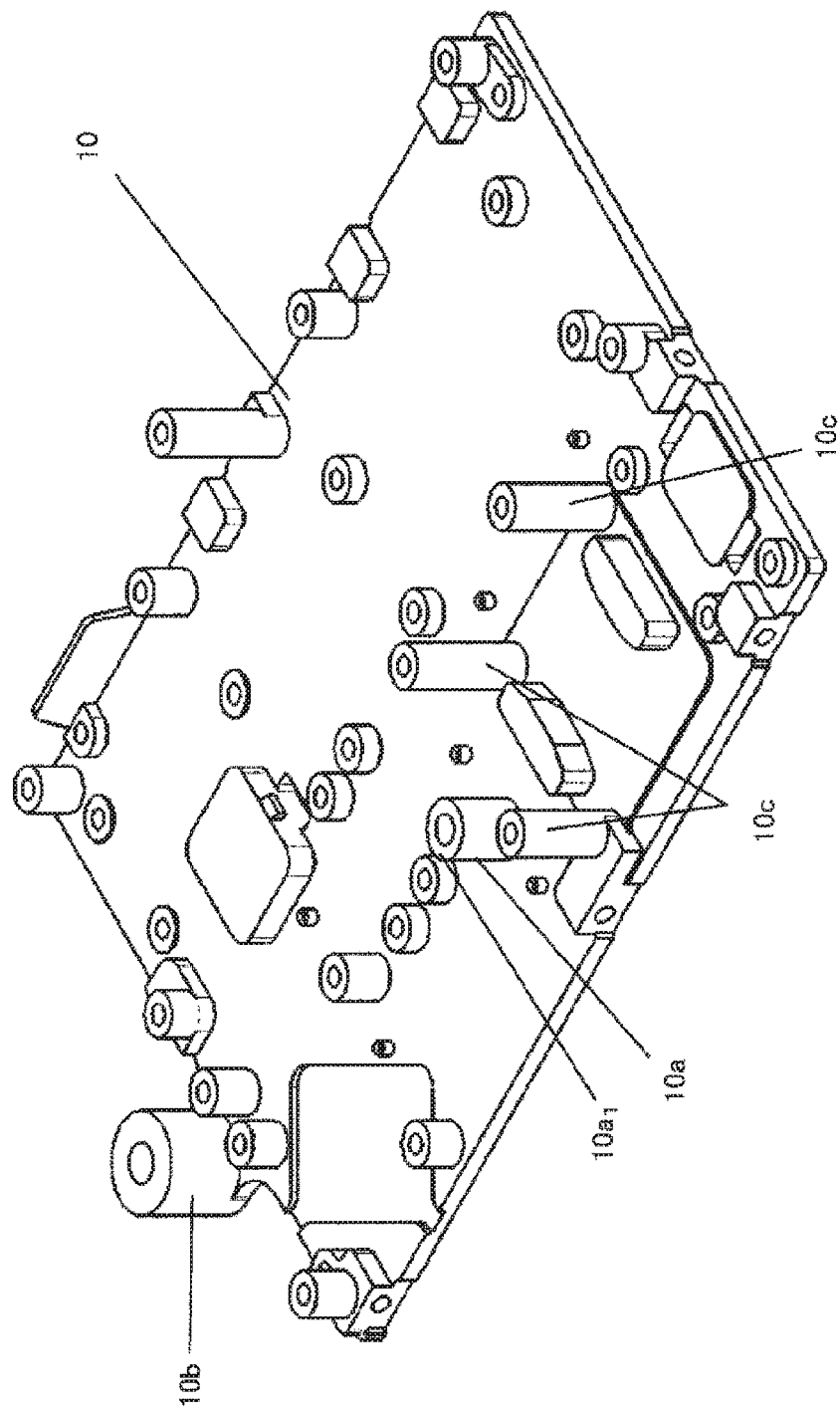
FIG. 9 is an enlarged view of a metal base of FIG. 2.

FIG. 9 illustrates an enlarged perspective view of the metal base 10. A GND protruding terminal 10b to connect a GND-side terminal of low voltage output is molded in the metal base 10 in an integrated manner. In addition, a GND protruding terminal 10a (protruding portion), which is configured to ground a ground pattern 302a (see FIG. 12) to be described later, and a protruding terminal 10c, which is configured to attach. the main transformer 250, and the like are molded in the metal base 10 in an integrated manner. Further, a high voltage connector (not illustrated) to input the high voltage, a signal connector (not illustrated) to connect an external electrical component and a signal or the like, and an output terminal (not illustrated) to output the low voltage output are attached to the exterior of the metal base 10.

As illustrated in FIG. 2, a cooling unit 800 is attached to a bottom surface of the metal base 10 via a seal member such as an O-ring (not illustrated). A cooling channel is provided in the cooling unit 800, and a heat generating part inside the DC-DC converter apparatus 100 is cooled by coolant flowing in this cooling channel. In general, a mixture of antifreeze and water at a ratio of 1:1 is suitable as the coolant, and another coolant can be also used. The cooling device to cool the DC-DC converter apparatus 100 is illustrated as an embodiment, and there is no harm in using another cooling device which uses a cooling gas such as air or the like.

(Drive Circuit Board Assembly)

Figure 10:
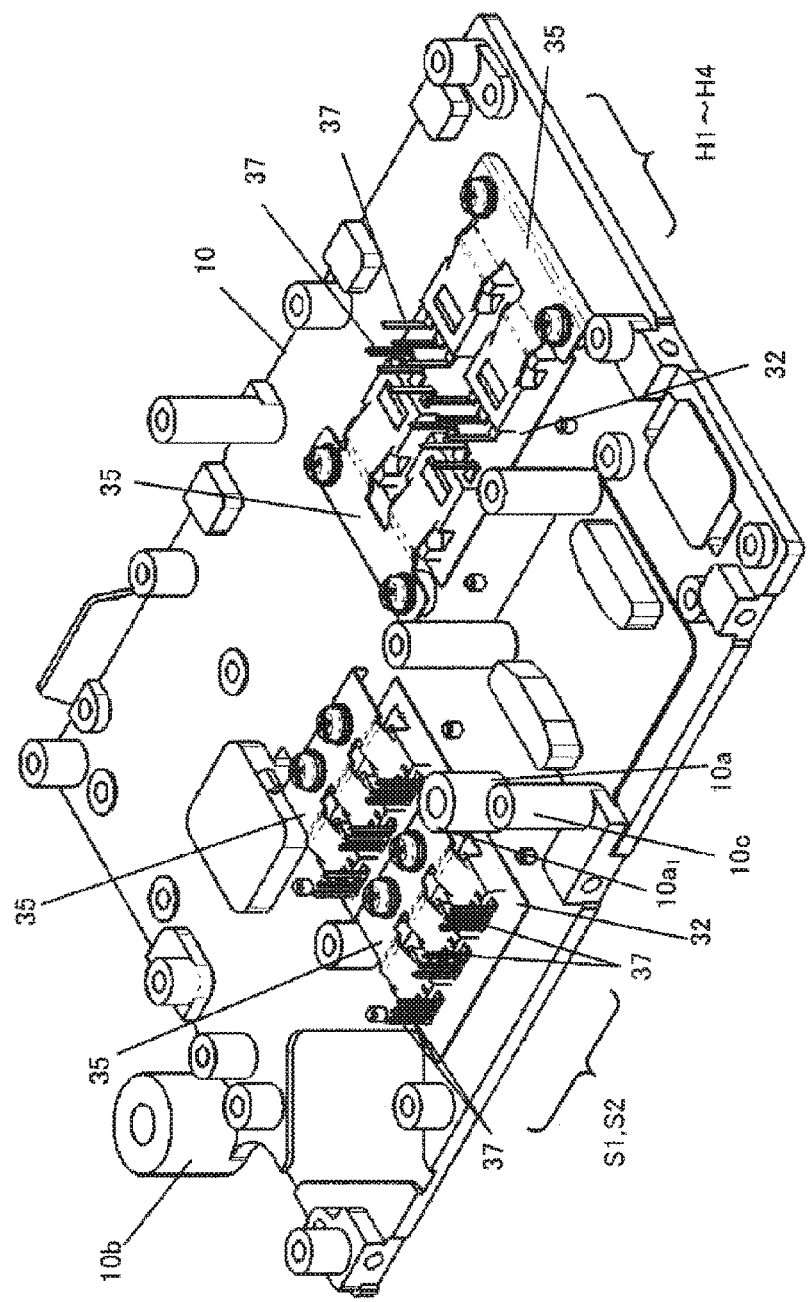
FIG. 10 is a perspective view in which a switching element and a rectifier element are attached to the metal base of FIG. 9.

FIG. 10 is a perspective view in which a switching element and the rectifier element are attached to the metal base. The following description will be given with reference to FIG. 10 in addition to FIGS. 2, 3(a) and 3(b). The drive circuit board assembly 300A is configured by mounting the component parts of the high-voltage-side switching circuit 210 and the component parts of the low-voltage-side rectifier circuit 220, which have been described in FIG. 1, to a drive circuit board 300 formed using a single glass epoxy board. That is, the drive circuit board assembly 300A is configured by implementing the MOSFET's H1 to H4, the smoothing input capacitor 202 (Cin), and an electronic part such as a gate resistance (not illustrated), which configure the high-voltage-side switching circuit 210, and the MOSFET's S1 and S2, the choke coil 206 (Lout), the smoothing capacitor 208 (Cout), the filter coil 207 (L1) and the filter capacitor 205 (C1) configuring the smoothing circuit, the shunt resistance 230 (Ri) for the detection of current and an electronic part such as a gate resistance (not illustrated) which configure the low-voltage-side rectifier circuit 220. Each terminal of the MOSFET's H1 to H4, S1 and S2 is electrically connected to a circuit pattern of the drive circuit board 300 by soldering. The circuit pattern will be described later with reference to FIGS. 11 and 12.

(Mounting Structure of DC-DC Converter Apparatus 100)

A bus bar molded body 400, which includes metal conductors $402A_1$ and $402A_2$, and the like, is mounted in a region to which the MOSFET's S1 and S2 of the drive circuit board assembly 300A are connected. Details of the bus bar molded body 400 will be described later.

The MOSFET's H1 to H4, which serve as the switching elements mounted in a high-voltage circuit region of the drive circuit board 300, and the MOSFET's S1 and S2, which serve as the rectifier elements mounted in a low-voltage circuit region of the drive circuit board 300, are fixed in close contact with the metal base 10 using a leaf spring 35 via an insulating heat. dissipation sheet 32 having a favorable thermal conductivity. The MOSFET is cooled by the coolant flowing in the cooling channel of the cooling unit 800 described above. Each of the MOSFET's H1 to H4 and the MOSFET's S1 and S2 is connected to the drive circuit board 300 via a connection lead 37 (see FIG. 10 and the like).

The main transformer 250, the choke coil 206, and the filter coil 207 are arranged on the metal base 10 in the state of being fixed by a fastening member. The metal base 10, the drive circuit board assembly 300A, the control circuit board assembly 600A, the main transformer 250, the choke coil 206, and the filter coil 207 are covered by the top cover 1 made of metal.

The control circuit board assembly 600A is configured by mounting a drive signal generation circuit, which generates a drive signal to drive the MOSFET's of the high-voltage-side switching circuit 210 and the low-voltage-side rectifier circuit 220 described in FIG. 1, onto a control circuit board 600 formed using a single glass epoxy board. The control circuit board assembly 600A is connected to a drive circuit of the drive circuit board assembly 300A via a direct connector. A flexible wiring board and a signal harness may also be used for the connection other than the direct connector.

Figure 4:
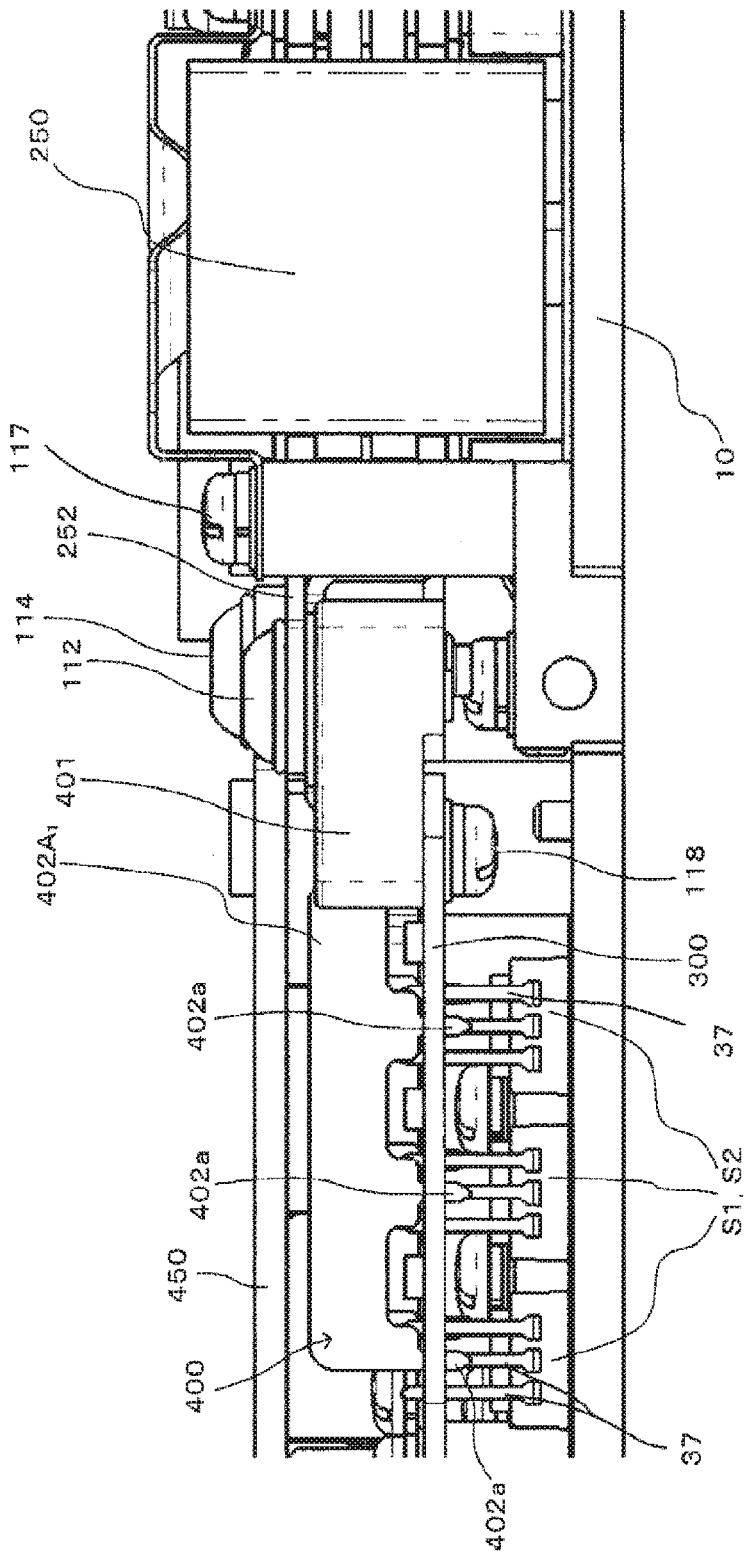
FIG. 4 is an enlarged side view of a main section of FIG. 3B.

FIG. 3(a) is a diagram of mounting parts of the metal base 10 which is seen from above, FIG. 3(b) is a side view of FIG. 3(a) seen from IIIb, and FIG. 4 is an enlarged view of the main section of FIG. 3(b). In this specification, the bus bar molded body 400, the choke coil 206, and the filter coil 207, which configure the low-voltage-side rectifier circuit 220, are particularly called mounting parts on a first surface side of the drive circuit board 300. In addition, the MOSFET's S1 and S2, which are the low-voltage-side rectifier elements, are called mounting parts on a second surface side of the drive circuit board 300. The mounting parts on the second surface side are arranged in close contact with the metal base 10, and all the parts are hierarchically arranged on a lateral side of the main transformer 250. In other words, the drive circuit board 300 is arranged above the metal base 10 with a predetermined interval, and the MOSFET's S1 and S2 for rectification are arranged in close contact with the metal base 10 below the low-voltage circuit region of the drive circuit board 300.

(Structure of Bus Bar Molded Body)

Figure 5:
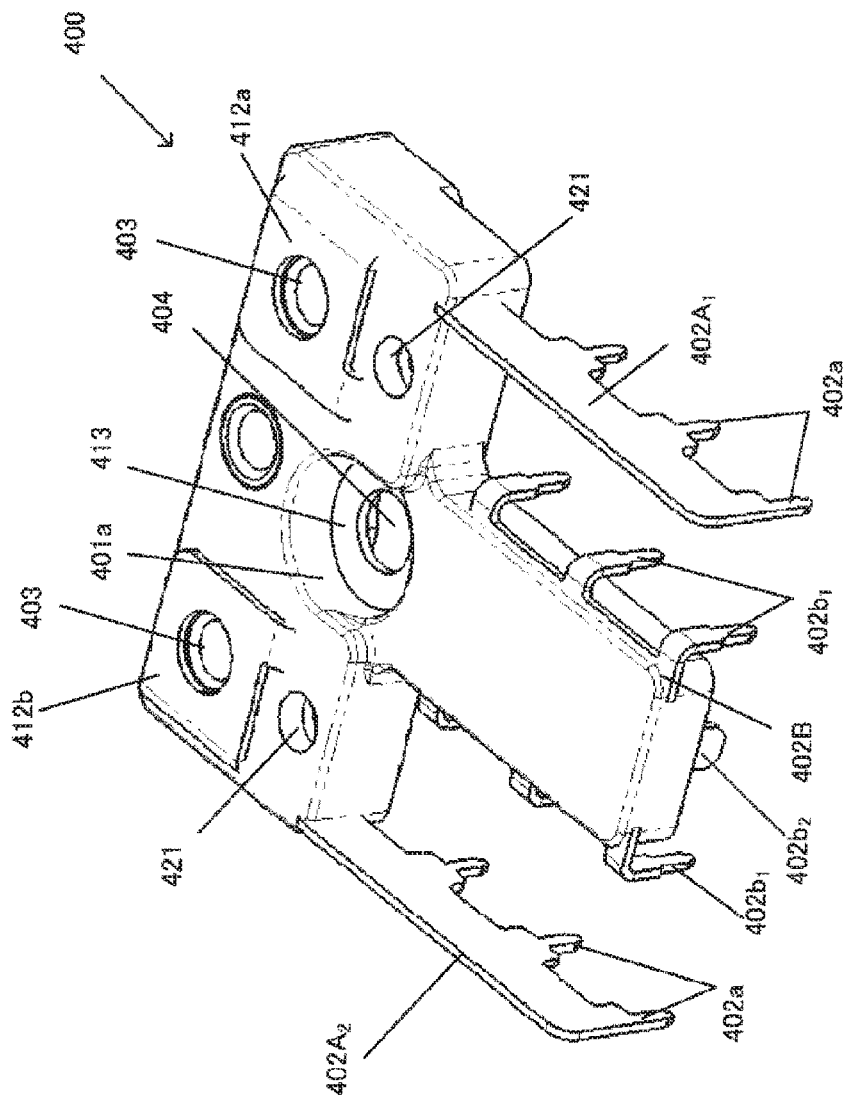
FIG. 5 is an enlarged view of a bus bar molded body of FIG. 2.
Figure 6:
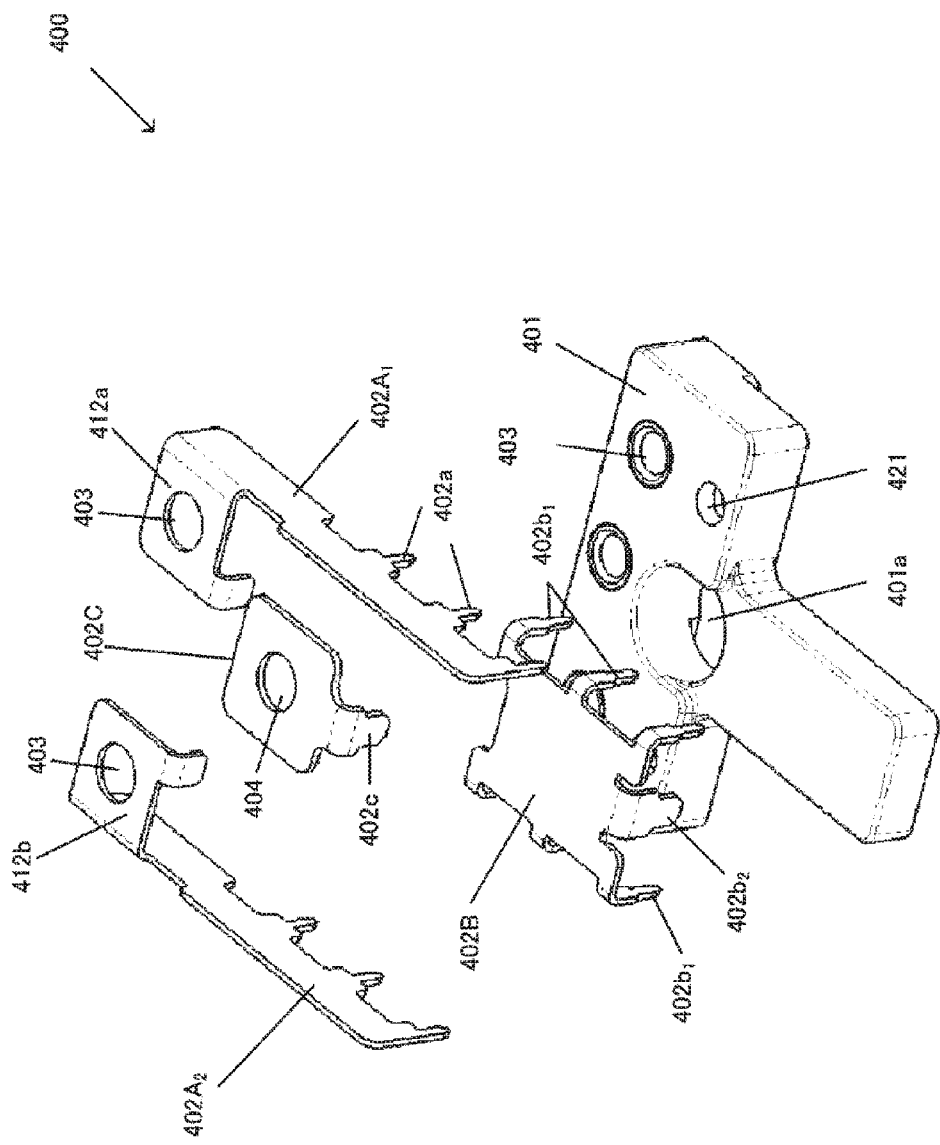
FIG. 6 is an exploded perspective view of the bus bar molded body.
Figure 7:
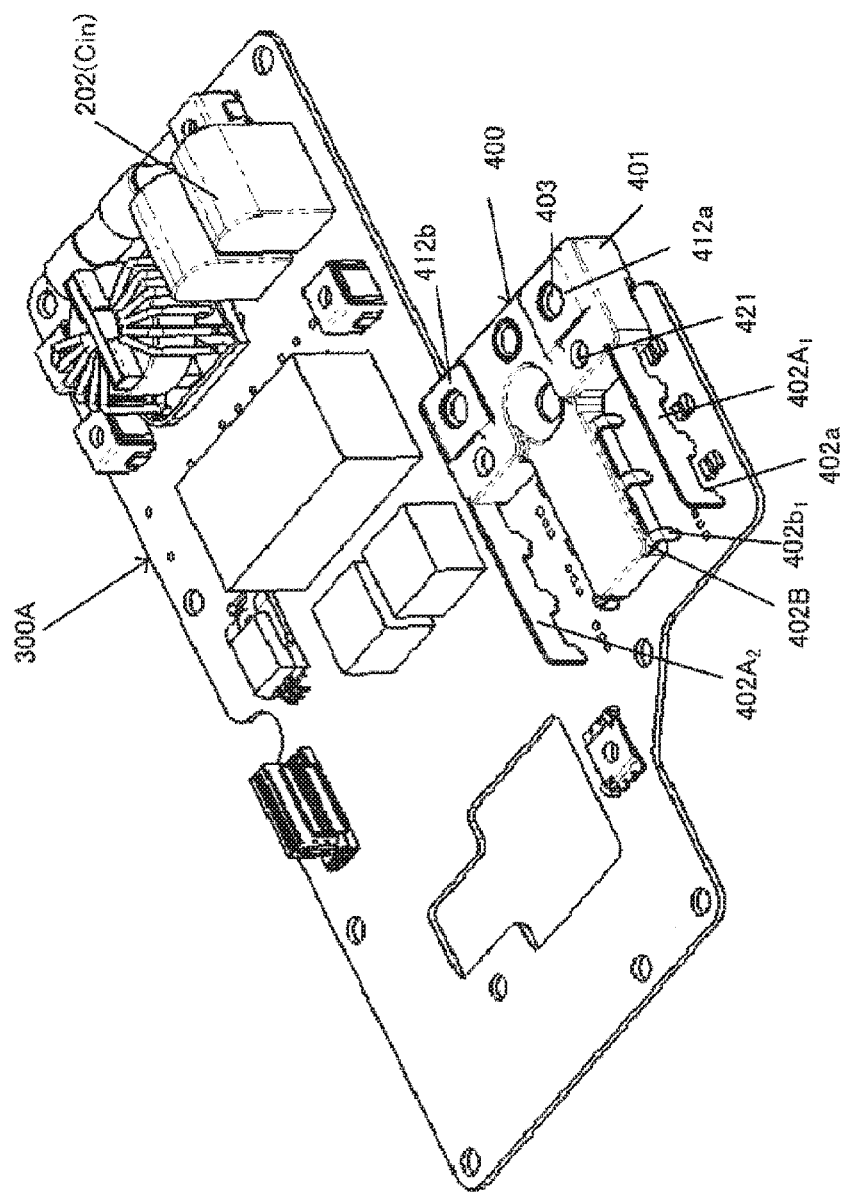
FIG. 7 is a perspective view of a drive circuit board assembly in which the bus bar molded bod is attached to a drive circuit board of FIG. 2.
Figure 8:
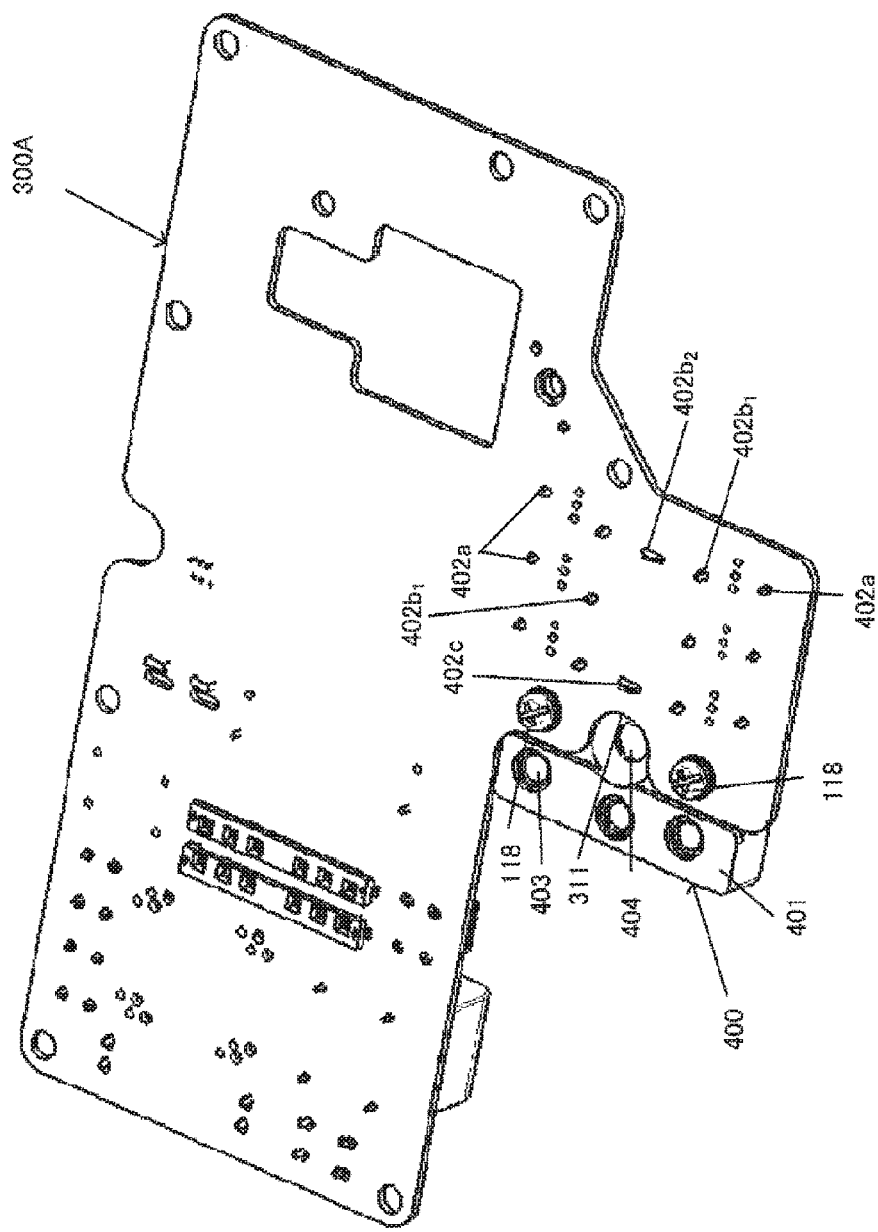
FIG. 8 is a perspective view of the drive circuit board assembly of FIG. 7 seen from a rear surface thereof.

FIG. 5 is an enlarged view of the bus bar molded body of FIG. 2, and FIG. 6 is an exploded perspective view of the bus bar molded body. In addition, FIG. 7 is a perspective view of the drive circuit board assembly in which the bus bar molded body is attached to the drive circuit board of FIG. 2, and FIG. 8 is a perspective view of the attached drive circuit board assembly of FIG. 7 seen from a rear surface thereof. As illustrated in FIG. 5, the bus bar molded body 400 is formed such that the high-potential-side metal conductors $402A_1$ and $402A_2$, the low-potential-side metal conductor 402B, and the ground metal conductor 402C are molded in a base portion. 401, which has an insulation property and is made of resin, in an integrated mariner using a resin mold. The base portion 401 is formed using resin with high heat resistance (for example, PPS or the like). The base portion 401 is not provided as a single body, and thus, the base portion 401 of FIG. 6 is illustrated in order to facilitate understanding. The high-potential-side metal conductors $402A_1$ and $402A_2$ are formed to have axisymmetric shapes, and three protruding terminals 402a, which protrude toward. the drive circuit board 300, are formed with predetermined pitch on each lower end surface of the high-potential-side metal conductors $402A_1$ and $402A_2$ In addition, one attachment hole 403 is formed on the base portion 401 side of each of the high-potential-side metal conductors $402A_1$ and 402A. Three protruding terminals $402b_1$, which protrude toward the drive circuit board 300 with a predetermined pitch on each lower end surface of side surfaces opposing each other of the low-potential-side metal conductor 402B, and a protruding terminal $402b_2$ is formed on a side surface thereof on the opposite side of the base portion 401 An attachment hole 404 is formed on the base portion 401 side of the ground metal conductor 402C, and a protruding terminal 402c, which protrudes toward the drive circuit board 300, is formed on a side surface thereof on the opposite side of the base portion 401.

The high-potential-side metal conductors $402A_1$ and $402A_2$ include terminal portions 412a and 412b, respectively, in which the perimeter of the attachment holes 403 are exposed to a top surface side of the base portion 401. In addition, a part in which the three protruding terminals 402a of each of the high-potential-side metal conductors $402A_1$ and $402A_2$ are formed protrudes outwardly from a side surface of the base portion 401. The three protruding terminals $402b_1$ and the single protruding terminal $402b_2$ of the low-potential-side metal conductor 402B protrude from the base portion 401. The ground metal conductor 402C is arranged below a portion between the high-potential-side metal conductors $402A_1$ and $402A_2$, and a terminal portion (exposed portion) 413, which exposes from the attaching hole 401a formed in the base portion 401, is provided in the perimeter of the attachment hole 403.

(Mounting Structure of Bus Bar Molded Body)

Figure 11:
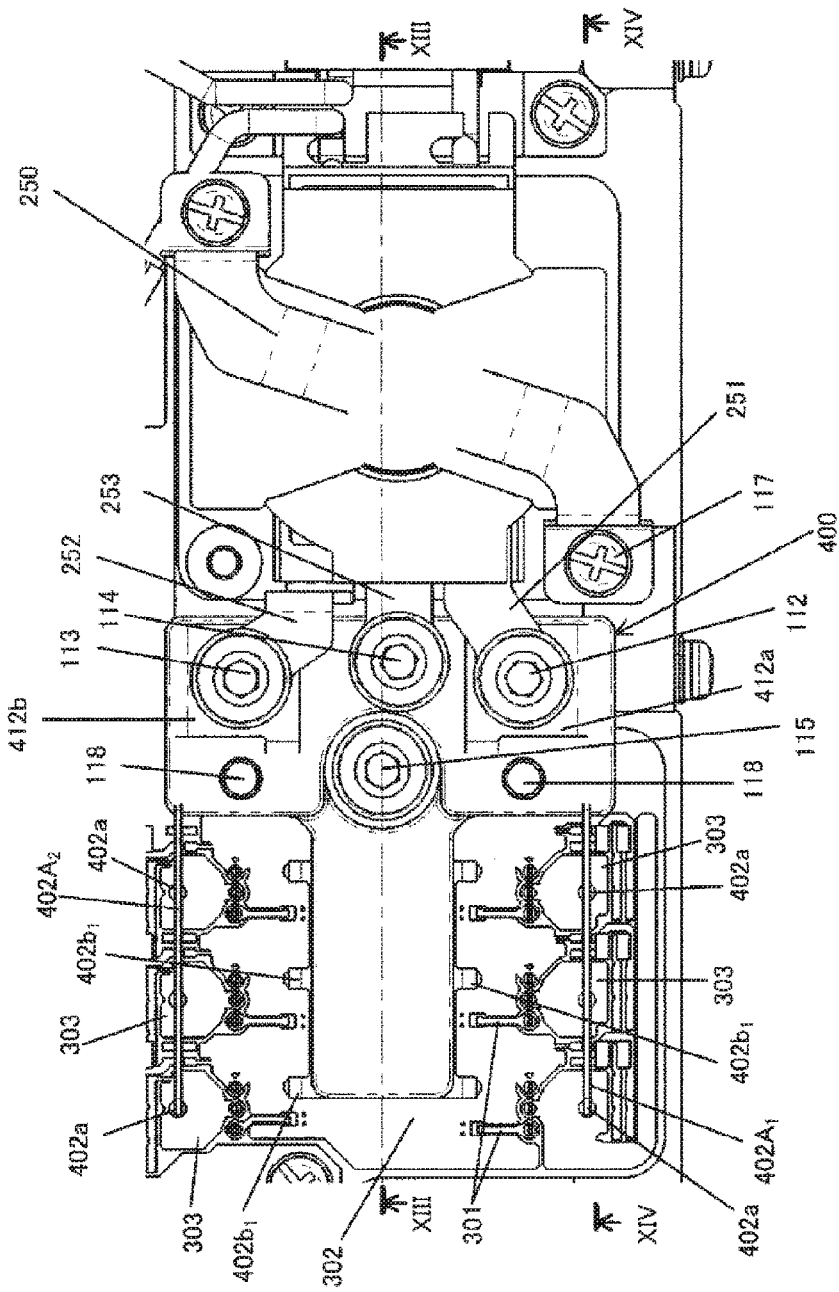
FIG. 11 is an enlarged view of a main section of FIG. 3A.
Figure 12:
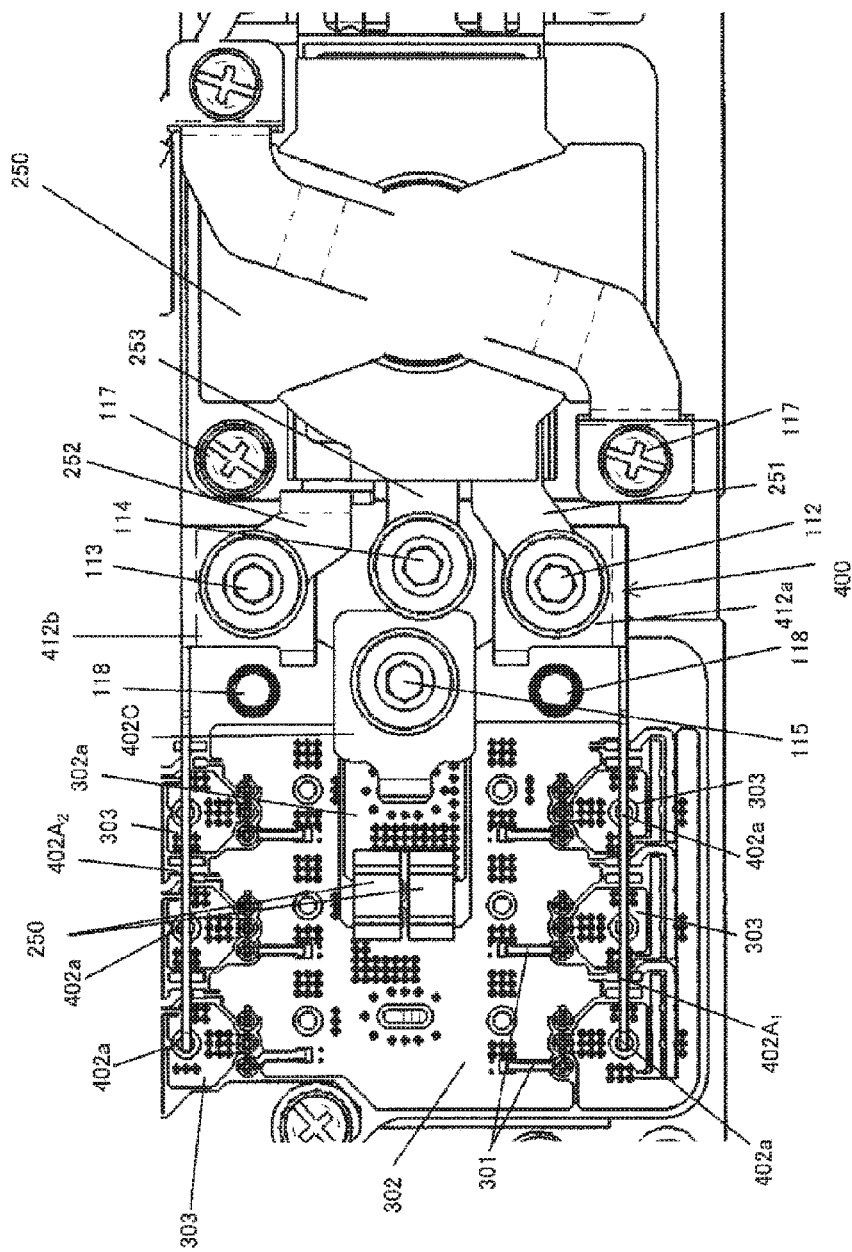
FIG. 12 is a diagram in which a low-potential-side metal conductor is removed from FIG. 11.
Figure 13:
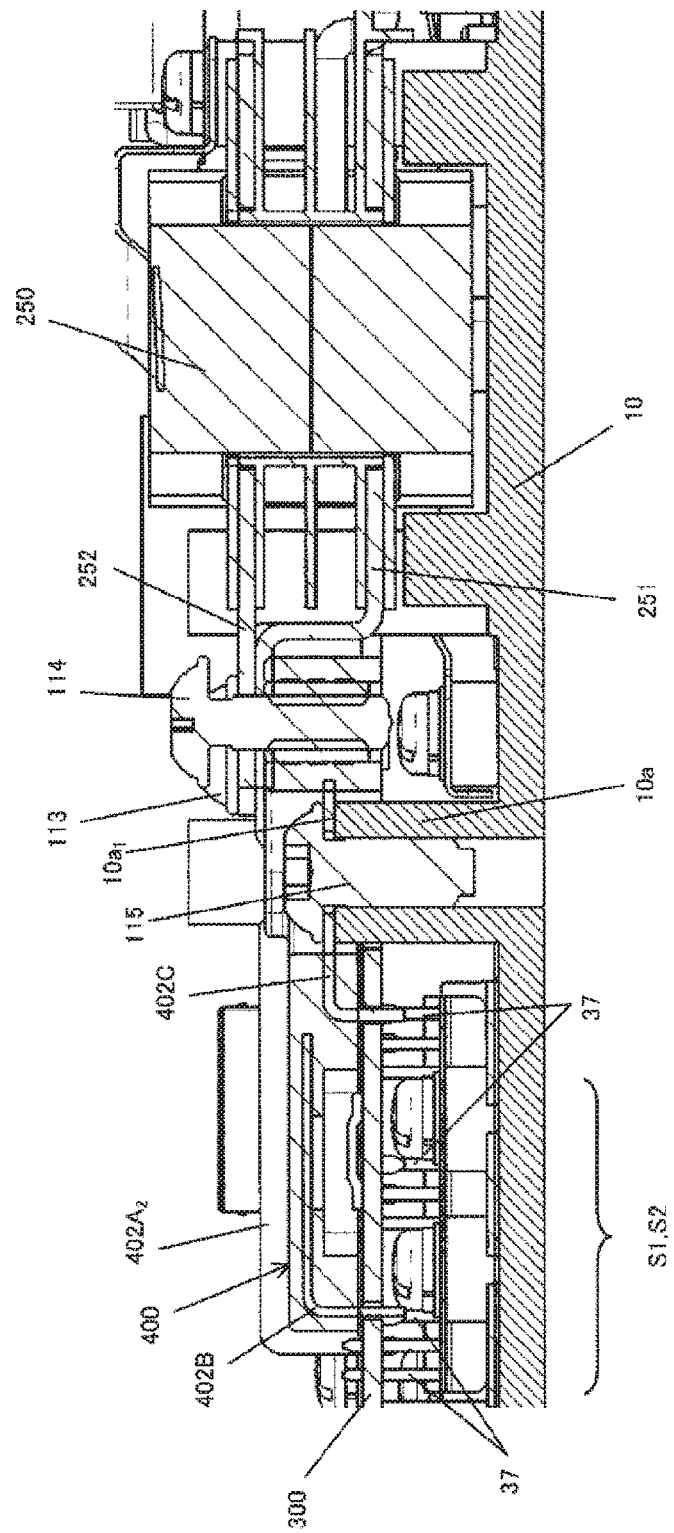
FIG. 13 is a cross-sectional view taken along a line XIII-XIII of FIG. 11.
Figure 14:
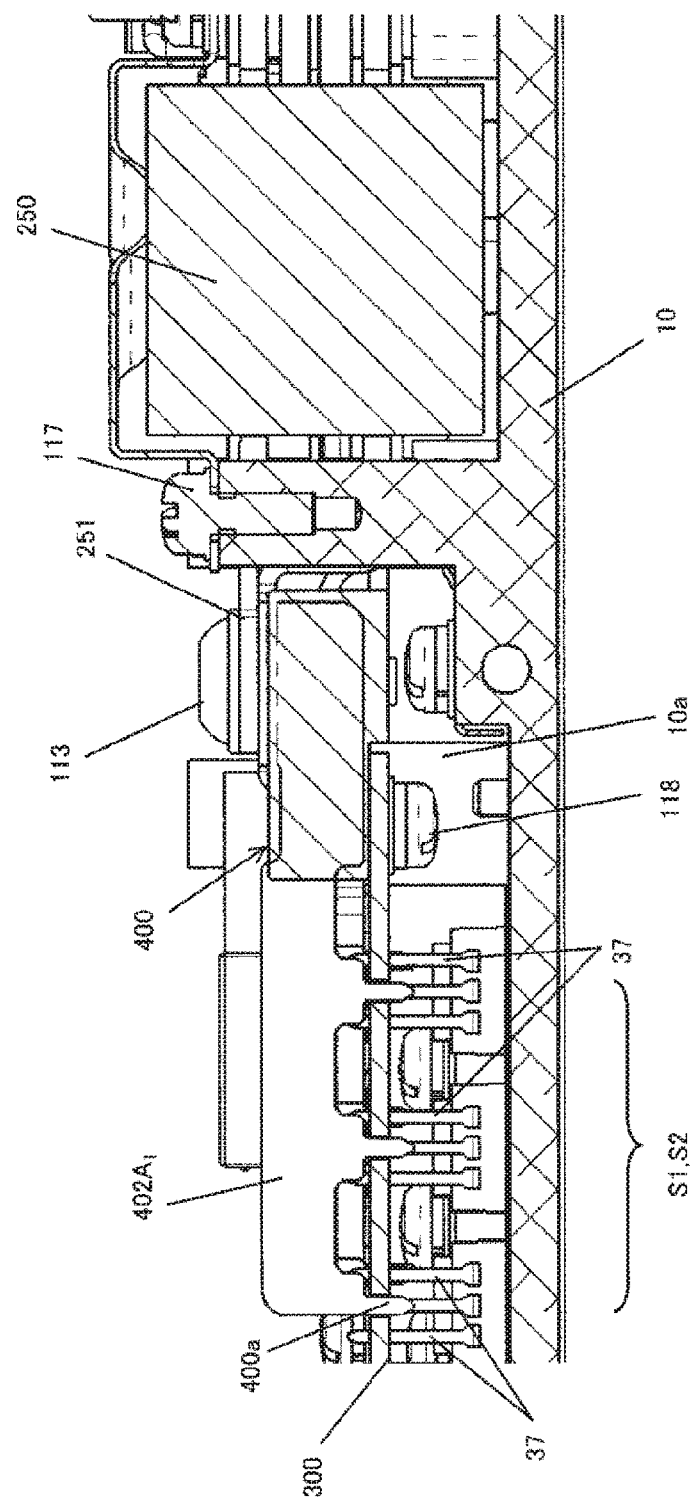
FIG. 14 is a cross-sectional view taken along a line XIV-XIV of FIG. 11.

FIG. 11 is an enlarged view in the vicinity of the main transformer 250 of FIG. 3(a), and FIG. 12 is a diagram in which the low-potential-side metal conductor 402B is removed from FIG. 11. In addition, FIG. 13 is a cross-sectional view taken along a line XIII-XIII of FIG. 11, and FIG. 14 is a cross-sectional view taken along a line XIV-XIV of FIG. 11. As described above, the low-voltage-side rectifier circuit 220 is provided with the three pairs of the MOSFET's S1 and S2 (six, in total) in FIGS. 11 to 14.

As illustrated in FIGS. 11 and 12, a wiring for the drive signal, that is, the first wiring pattern 301, which transmits the drive signal to drive the MOSFET's S1 and S2 serving as the low-voltage rectifier elements, the second wiring pattern 302 and the third wiring pattern 303 for the main current which transmit the main current to the MOSFET's S1 and S2, and the ground pattern 302a (see FIG. 12) are provided in the drive circuit board 300. The first wiring pattern 301 is connected to each gate terminal of the MOSFET's S1 and S2. The second wiring pattern 302 is connected to each source terminal of the MOSFET's S1 and S2, and the third wiring pattern 303 is connected to each drain terminal of the MOSFET's S1 and S2.

The protruding terminals 402a, $402b_1$, $402b_2$ and 402c of the bus has molded body 400 are plugged into through-holes of the drive circuit board 300, and are soldered to a land formed on the rear surface of the drive circuit board 300 using a jet solder bath or the like. The predetermined pitch of the through-hole of the drive circuit board 300 and the protruding terminals 402a, $402b_1$ and $402b_2$ of the bus bar molded body 400 is the same value as an arrangement pitch of the MOSFET's serving as the rectifier element.

The bus bar molded body 400 is fixed to the drive circuit board 300 by tapping a tapping screw 118 into a through-hole 421 formed in the base portion 401 and the through-hole of the drive circuit board 300 as illustrated in FIGS. 7 and 8. Incidentally, the fastening may be performed using the bolt and nut instead of the tapping.

An end portion of the first wiring pattern 301, connected to the control circuit 240, is connected to each gate terminal of the MOSFET's S1 and S2. The high-potential-side metal conductor $402A_1$ is connected to the drain terminal of the MOSFET S1 via the third wiring pattern 303. The terminal portion 412a of the high-potential-side metal conductor $402A_1$, connected to the drain terminal of the MOSFET S1, is fastened to the low-potential-side coil terminal 251 on the secondary side of the main transformer 250 by a bolt 112. The high-potential-side metal conductor $402A_2$ is connected to the drain terminal of the MOSFET S2 via the third wiring pattern 303. The terminal portion 412b of the high-potential-side metal conductor $402A_2$, connected to the drain terminal of the MOSFET S2, is fastened to the high-potential-side coil terminal 252 of the secondary side of the main transformer 250 by a bolt 113. In a case in which the drive circuit board 300 is provided with a plurality of pairs of the MOSFET's S1 and S2, each of the high-potential-side metal conductor $402A_1$ and the high-potential-side metal conductor $4102A_2$ connects drains of the MOSFET S1 or the MOSFET S1 of different pairs. Incidentally, the main transformer 250 is fixed to the protruding terminal 10c of the metal base 10 by a bolt 117 as illustrated in FIG. 14.

A description will be given also with reference to FIGS. 2, 3(a) and 3(b). The center tap terminal 253 of the main transformer 250 and a bus bar 450, which connects the center tap terminal 253 to the choke coil 206, are fastened together by a bolt 114. The bus bar 450 transversely extends toward the choke coil 206 on the front surface of the drive circuit board 300 while being spaced with a predetermined distance. The other terminal of the bus bar 450 is connected to an input terminal of the choke coil 206. An output terminal of the choke coil 206 is connected to the filter coil 207 via a bus bar 451.

The low-potential-side metal conductor 402B is connected to the second wiring pattern 302 connected to the source terminals of the MOSFET's S1 and S2 while allowing the protruding terminals $402b_1$ and $102b_2$ to be inserted into the through-holes of the drive circuit board 300. The shunt resistance 230 is arranged between the second wiring pattern 302 and the ground pattern 302a. Incidentally, although the embodiment in the case of using the shunt resistance 230 is described, a circuit which does not include the shunt resistance 230 may be configured.

The protruding terminal 402c of the ground metal conductor 402C penetrates the through-hole of the drive circuit board 300, and is soldered to the land on the rear surface. As illustrated in FIG. 8, a semicircular notch 311 is formed on the side surface of the drive circuit board 300 to which the bus bar molded body 400 is attached, and the GND protruding terminal 10a of the metal base 10 is arranged on the outside of, the notch 311 of the drive circuit board 300 (see FIG. 13). As illustrated in FIG. 13, the ground metal conductor 402C is placed on a top surface 10a1 of the GND protruding terminal 110a, and is fixed to the metal base 10 by screwing a bolt 115 to a female screw portion formed in the GND protruding terminal 10a through the attaching hole 401a of the base portion 401. Accordingly, the ground pattern 302a of the drive circuit board 300 is grounded via the metal base 10. In this manner, the bus bar molded body 400 is fixed to the front surface of the drive circuit board 300 that is, the first surface by the tapping screw 118, and is fixed to the drive circuit board 300 by placing the ground metal conductor 402 exposed to the second surface side on the GND protruding terminal 10a and screwing the bolt 115 to the female screw portion thereof.

As above, the first wiring pattern 301 to transmit the drive signal, and the second wiring pattern 302, the third wiring pattern 303 and the ground pattern 302a to transmit the main current to the rectifier element are formed on the low-voltage-side rectifier circuit 220 side of the drive circuit board 300 in the DC-DC converter apparatus 100 of the embodiment. The two coil terminals 251 and 252 of the main transformer 250 and the drain terminals of the MOSFET's S1 and S2 serving as the rectifier elements are connected to each other via the second and third wiring patterns 302 and 303 for the main current on the drive circuit board 300 and the high-potential-side metal conductors $402A_1$ and $402A_2$ of the bus bar molded body 400. The source terminals of the MOSFET's S1 and S2 are connected to each other via the second wiring pattern 302 of the low potential side on the drive circuit board 300 and the low-potential-side metal conductor 402B of the bus bar molded body 400.

In addition, on, the ground pattern 302a of the drive circuit board 300 is grounded via the metal base 10 using the ground metal conductor 402C; of the bus bar molded body 100. The ground pattern 302a and the ground metal conductor 402C are connected to each other when the bolt 115 is screwed to the GND protruding terminal 10a of the metal base 10.

Incidentally, although not illustrated in FIGS. 11 and 12, a wiring pattern for a drive signal, which transmits a drive signal to drive the MOSFET's H1 to H4 serving as the high-voltage switching elements, and a high-potential-side wiring pattern and a low-potential-side wiring pattern for a main current which transmit the a main current to the MOSFET's H1 to H4 are also formed in the drive circuit board 300. Further, similarly to the low-voltage-side rectifier element, three terminals provided in each of the MOSFET's H1 to H4 penetrate the drive circuit board 300, and are electrically connected to the circuit pattern of the drive circuit board 300 by soldering as described above.

As described above, the following operational effects are obtained according to the DC-DC converter apparatus 100 of the embodiment.

(1) The second wiring pattern 302, the third wiring pattern 303, and the ground pattern 302a, which supply the main. current to each of the rectifier elements S1 and S2, are provided on the low-voltage-side rectifier circuit section 220 side of the drive circuit board 300. Further, the ground metal conductor 402C, connected to the ground pattern 302a, is placed on the top surface 10a1 of the GND protruding terminal 10a of the metal base 10, and is fastened, using the bolt 115, and fixed to the metal base 10 while being grounded via the metal base 10. In this structure, the ground metal conductor 402C is arranged on the outside of the notch 311 of the drive circuit board 300, and thus, the fastening force caused by the bolt 115 is not applied to the drive circuit board 300. Thus, it is possible to prevent the crack in the drive circuit board 300 or the peeling-off of the pattern.

(2) The third wiring pattern 303, connected with the drain terminals of the plurality of pairs of rectifier elements S1 and S2, are connected to the coil terminals 251 and 252 of the main transformer 250 using the high-potential-side metal conductors $402A_3$ and $402A_2$. In addition, the high-potential-side metal conductors $402A_1$ and $402A_2$ are molded in the insulating base portion 401 together with the ground metal conductor 402C in an integrated manner using the resin mold. Thus, it is possible to perform the insertion of the protruding terminals 402a of the high-potential-side metal conductors $402A_1$ and $402A_2$ and the protruding terminal 402c of the ground metal conductor 402C into the through-holes of the drive circuit board 300 at the same time, and thus, the assembling workability is favorable.

(3) In addition, the second wiring patterns 302 to which the source terminals of the plurality of pairs of rectifier elements S1 and S2 are connected are connected to each other using the low-potential-side metal conductor 402B. The low-potential-side metal conductor 402B is molded in the base portion 401 made of resin together with the ground metal conductor 402C in an integrated manner. Thus, it is possible to perform the insertion of the protruding terminals 402a of the high-potential-side metal conductors $402A_1$ and $402A_2$, the protruding terminal 402c of the ground metal conductor 402C, and the protruding terminals $402b_1$ and $402b_2$ of the low-potential-side metal conductor 402B into the through-hole of the drive circuit board 300 at the same time, and thus, the assembling workability is more favorable.

(4) In a case in which the plurality of metal conductors $402A_1$, $402A_2$, 402B and 402C are provided as different parts, it is necessary to mount the respective metal conductors to the board. However, it is possible to form a sub-assembly part of the respective metal conductors by securing the metal conductors $402A_1$, $402A_2$, 402B and 402C, which have been integrated. with the base portion 401 using resin, to the drive circuit board 300 using the screw to be fixed only by the soldering, and it is possible to simplify a board manufacturing process. Further, it is possible to perform soldering including the bus bar wiring at the time of sub-assembly of the board, and thus, it is possible to improve the production efficiency in a final assembly process.

(5) The bus bar molded body 400 is fixed to the drive circuit board 300 by the tapping or the fastening member. Thus, it is possible to reinforce the drive circuit board 300 using the bus bar molded body 400. Accordingly, it is possible to improve the vibration resistance of the drive circuit board 300.

(6) The bus bar molded body 400 has a structure in which the terminal portions 412a and 412b of the high-potential-side metal conductors $402A_1$ and $402A_2$ are exposed from the base portion 401 made of resin. Thus, it is possible to fix the terminal portions 412a and 412b to the coil terminals 251 and 252 on the secondary side of the main transformer 250 using the bolts 112 and 113 in the conducting state, and the assembly structure becomes simple. Accordingly, it is possible to reduce the number of the bus bars, which contributes to cost reduction.

(7) In the DC-DC converter apparatus 100, the high-voltage-side switching circuit t 210 and the low-voltage-side rectifier circuit 220 are mounted to the drive circuit board 300, and the drive circuit board 300 is arranged above the metal base 10. Further, at least the pair of rectifier elements S1 and S2 is arranged in close contact with the metal base 10 below the drive circuit board 300. According to the DC-DC converter apparatus 100 of the embodiment configured as above, it is possible to decrease an installation area, and to achieve reduction in cost through reduction in the number of parts. In addition, it is possible to achieve the improvement of assembling workability through the integration of the board. In the case of adopting a structure in which a low-voltage circuit board and a high-voltage circuit board are divided, a metal substrate is used for the low-voltage circuit board, and a bus bar on the metal substrate is used for a rectifier element, which rectifies current on a secondary side of a transformer, to transmit a drive signal, there is a problem that the cost increases due to the use of expensive metal substrate, and an increase in the number of parts of the bus bars.

(8) The main transformer 250 is installed to the metal base 10, and the drive circuit board 300 is arranged at a position lower than a maximum height of the main transformer 250. Accordingly, it is possible to restrict the overall height of the DC-DC converter apparatus 100 with a height of a part having a high height such as the main transformer 250, and it is possible to reduce the volume of the DC-DC converter apparatus 100 in combination with the effect of decreasing the installation area.

(9) The respective drain terminals on the high potential side of the main current of at least the pair of rectifier elements S1 and S2 are connected. to the two coil terminals 251 and 252 on the secondary side of the transformer via at least a pair of the high-potential-side metal conductors $402A_1$ and $402A_2$ from at least a pair of the third wiring patterns 303 for the main current on the high potential side. Accordingly, it is possible to reduce the number of the bus bars.

(10) Each one end of the high-potential-side metal conductors $402A_1$ and $402A_2$ is integrated with the insulating base portion 401 using the resin mold of the base portion 401. The mounting parts which require a certain insulation distance are interspersed on the first surface side of the drive circuit board 300 on which the bus bar molded body 400 is arranged in general, it is necessary to secure the spatial distance with respect to the mounting parts in the case of arranging the bus bar, and accordingly, the board mounting area increases in some cases. According to the embodiment, the insulation through the resin is possible, and thus, the request for consideration of the insulation distance with respect to the board the mounting parts is relieved, a degree of freedom increases in the layout of the mounting parts, and it is possible to reduce the size of the board by reducing the board mounting area.

(11) The pitch of the protruding terminals 402a, 402$b_1$ and 402$b_2$ of the high-potential-side metal conductors 402$A_1$ and 402$A_2$, and the low-potential-side metal conductor 402B is set. to match with the arrangement pitch of the rectifier element. Accordingly, it is possible to configure the shortest board pattern, to achieve the reduction in size of the board, and to effectively utilize the capacity, thereby enabling the reduction in size of the product.

(12) As the component parts has the hierarchical arrangement structure by arranging the metal conductors 402$A_1$, 402$A_2$, 402B and 402C on the first surface, that is, the front surface of the drive circuit board and arranging the rectifier elements on the second surface side, that is, the rear surface side which is the opposite side of the first surface, the component parts can be accommodated within a positional height of the transformer, which has a high mounting height among the electronic parts, and the overall height of the device is suppressed, and thus, it is possible to provide the DC-DC converter apparatus which is reduced in size.

(13) Further, when the drive circuit board 300 is used, the wiring for the drive signal transmitted on the metal substrate is connected to the first wiring pattern 301, which transmits the drive signal using the pattern on the wiring board, and the second wiring pattern 302 and the third wiring pattern 303 which transmit the main current to the rectifier element. Accordingly, it is possible to abolish the bus bar on the metal substrate, and further, to cause the low-voltage-side rectifier circuit 220 to be integrated with the drive circuit board 300 together with the high-voltage-side switching circuit 210, thereby enabling the reduction in the manufacturing cost.

(14) The rectifier elements S1 and S2 are arranged in close contact with the metal base 10 on the lateral side of the region in which the main transformer 250 of the metal base 10 is arranged, and are connected to the high-potential-side metal conductors 402$A_1$ and 402$A_2$ through the third wiring pattern 303 of the drive circuit board 300 above the rectifier elements S1 and S2. The high-potential-side metal conductors 402$A_1$ and 402$A_2$ to be connected to the main transformer 250 are connected to the drive circuit board 300 by soldering similarly to the rectifier elements S1 and S2, and are connected to the main transformer 250 across the side portion of the drive circuit board 300. In addition, the high-potential-side metal conductors 402$A_1$ and 402$A_2$ are connected to the third wiring pattern 303, which is connected with the high-potential-side terminals of the rectifier elements S1 and S2, on the drive circuit board 300. Accordingly, it is possible to form the wiring pattern and the bus bar on the board with the shortest length, and thus, it is possible to effectively utilize the capacity of the device.

The DC-DC converter apparatus of the embodiment. can be modified and implemented as follows.

(1) The structure has been exemplified in which the ground metal conductor 402C, which causes the ground pattern 302a to be grounded to the metal base 10, is integrated with the base portion 401 formed using the insulating material as the bus bar molded body 400. However, the ground metal conductor 402C may be manufactured as a single body and attached to the GND protruding terminal 10a of the metal base 10.

(2) Each of the metal conductors 402$A_1$ and 402$A_2$, 402B may be manufactured as a single body.

(3) Each of the high-potential-side metal conductors 402$A_1$ and 402$A_2$, which has been integrated using the resin mold, and the low-potential-side metal conductor 402B, which has been integrated using the resin mold, may be mounted to the drive circuit board 300 as different bodies. In the above structure, the low-potential-side metal conductor 402B and the ground metal conductor 402C may be integrated using a resin mold.

(4) The metal conductors 402$A_1$, 402$A_2$, 402B and 402C and the base portion 401 have been exemplified to be molded in an integrated manner using the resin mold. However, the metal conductors 402$A_1$, 402$A_2$, 402B and 402C and the base portion 401 maybe manufactured as different bodies and be assembled using a fastening member or the like.

(5) The terminal portion 413 of the ground metal conductor 402C is fixed onto the top surface 10a1 of the GND protruding terminal 10a of the metal base 10. However, the GND protruding terminal 10a may be configured such that an upper portion thereof is formed as a stepped protruding terminal with a narrow width, and the stepped portion functions as the attachment surface of the ground metal conductor 402C. The upper portion with the narrow width is arranged on the outside of the side portion of the drive circuit board 300 or arranged at a position to be inserted into the through-hole provided in the drive circuit board 300.

(6) The ground metal conductor 402C is grounded onto the top surface 10a1 of the GND protruding terminal 10a of the metal base 10, and is fixed to the metal base 10 using the bolt 115. However, the ground metal conductor 402C may be fixed directly onto the top surface 10a1 of the GND protruding terminal 10a in a pressure contact state using another constituent member, for example, a boss provided in the top cover 1 without being fastened using the bolt.

(7) Although the bus bar molded body 400 is fixed to the drive circuit board 300 using the screw 118, an arbitrary fixing method may be used as long as the mechanical fixation is possible. For example, the resin. portion of the bus bar molded body 400 is formed to include a protrusion shape and may be fixed with the board by heat welding. Alternatively, a connection mode using welding or soldering, for example, may be adopted as long as it is possible to electrically connect the bus bar molded body 400 and the main transformer 250.

(8) Although the resin with high heat resistance (for example, PPS or the like) is used as the resin used for the bus bar molded body 400 of the present. embodiment, a cheap resin with low heat resistance may be used in a case in which the temperature of the bus bar does not rise to high temperature.

(9) The drive circuit board 300 can be applied to a light and cheap resin substrate such as glass epoxy resin to achieve the cost reduction and the weight reduction, and also can be applied. to a metal circuit board.

(10) Although the drive circuit board 300 is provided with the high-voltage-side switching circuit 210 and the low-voltage-side rectifier circuit 220 in the above-described embodiment, the low-voltage-side rectifier circuit 220 may be provided as a body separated from the high-voltage-side switching circuit 210.

(10) The DC-DC converter apparatus has been exemplified as the power converter in the above-described embodiment. However, the present invention can be applied to other power converters such as an AC-DC converter apparatus and a DC-AC converter apparatus.

The above description is mere an example, and the present invention is not limited to the above-described embodiment. The present invention can be applied. to various modes of power converters in which the drive circuit board attached to the metal base is provided with the first and second wirings and the ground pattern to supply the main current to each of the rectifier elements and the ground metal conductor 402C to ground the ground pattern to the metal base is provided.

REFERENCE SIGNS LIST

1 top cover
10 metal base
10*a* GND protruding terminal
10*a*1 top surface (ground attachment surface)
S1, S2, H1 to H4 MOS-FET
32 insulating heat dissipation sheet
35 leaf spring
100 DC-DC converter apparatus
203 resonant coil
206 choke coil
210 high-voltage-side switching circuit
220 low-voltage-side rectifier circuit
240 control circuit
250 main transformer (transformer)
251 low-potential-side coil terminal
252 high-potential-side coil terminal
253 center tap terminal
300 drive circuit board
300A drive circuit board assembly
301 first wiring pattern
302 second wiring pattern (first and second wirings)
302*a* ground pattern
303 third wiring pattern (first and second wirings)
400 bus bar molded body
401 base portion
402*a*, 402*b*1, 402*b*2, 402*c* protruding terminal
402A1, 402A2 high-potential-side metal conductor
402B low-potential-side metal conductor
402C ground metal conductor
412*a*, 412*b*, 413 terminal portion
600 control circuit board
600A control circuit board assembly
S1, S2 rectifier element

The invention claimed is:

1. A power converter comprising:
a metal base in which a protruding portion including a ground attachment surface is provided;
a transformer which is mounted to the metal base and performs power conversion between an input side and an output side;
at least a pair of rectifier elements which controls input and output of current of the transformer;
a drive circuit board which is attached to the metal base, and in which first and second wirings and a ground pattern to supply a main current to each of the rectifier elements are provided; and
a ground metal conductor which is installed on the ground attachment surface of the protruding portion and is connected to the ground pattern;
wherein the protruding portion projects away from a main surface of the metal base toward the drive circuit board.

2. The power converter according to claim 1, further comprising
a base portion formed using an insulating material in which the ground metal conductor is held.

3. The power converter according to claim 2, wherein the ground metal conductor is molded in the base portion in an integrated manner using a resin mold.

4. The power converter according to claim 1, further comprising:
a first metal conductor which connects one output terminal of the transformer and the first wiring;
a second metal conductor which connects other output terminal of the transformer and the second wiring; and
a base portion which is formed using an insulating material to hold the first and second metal conductors.

5. The power converter according to claim 4, wherein the ground metal conductor and the first and second metal conductors are configured to be molded in the base portion in an integrated manner, as a bus bar molded body, using a resin mold.

6. The power converter according to claim 5, wherein the bus bar molded body is fixed to the drive circuit board.

7. The power converter according to claim 5, wherein the ground metal conductor includes a terminal portion exposed from the base portion to an outside, and the terminal portion is installed on the ground attachment surface of the protruding portion and is fixed to the protruding portion.

8. The power converter according to claim 5, further comprising
a low-potential-side metal conductor which connects a low potential side of the first wiring and a low potential side of the second wiring,
wherein the low-potential-side metal conductor is molded in the base portion of the bus bar molded body in an integrated manner.

9. The power converter according to claim 1, wherein the drive circuit board is further provided with a third wiring to which a drive signal to drive the pair of rectifier elements is supplied.

* * * * *